(12) United States Patent
Ishinaga

(10) Patent No.: US 6,180,962 B1
(45) Date of Patent: Jan. 30, 2001

(54) CHIP TYPE SEMICONDUCTOR LIGHT EMITTING DEVICE HAVING A SOLDER PREVENTIVE PORTION

(75) Inventor: Hiroki Ishinaga, Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/425,356

(22) Filed: Oct. 22, 1999

(30) Foreign Application Priority Data

Oct. 23, 1998 (JP) .................................................. 10-301780

(51) Int. Cl.[7] .................................................. H01L 33/00
(52) U.S. Cl. ............................ 257/99; 257/100; 257/787
(58) Field of Search .............................. 257/79, 99, 100, 257/787; 362/296, 341; 361/760

(56) References Cited

U.S. PATENT DOCUMENTS

| 5,612,512 | 3/1997 | Wakamatsu et al. | 174/260 |
| 5,962,917 | 10/1999 | Moriyama | 257/697 |

FOREIGN PATENT DOCUMENTS

| 57-079681 | 5/1982 | (JP) | H01L/33/00 |
| 61-240687 | 10/1986 | (JP) | H01L/33/00 |
| 02281648 | 11/1990 | (JP) | H01L/25/00 |
| 08250841 | 9/1996 | (JP) | H05K/3/34 |
| 8-330637 | * 12/1996 | (JP) | . |
| 10075041 | 3/1998 | (JP) | H05K/3/34 |
| 10-275875 | 10/1998 | (JP) | H01L/23/12 |

OTHER PUBLICATIONS

Kristufek, et al., *8229 Siemens Components*, entitled "Large–area displays with SMT–TOP–LED", 29 (1994) Mar./Apr., No. 2, Berlin, DE, pp. 30–32.

* cited by examiner

Primary Examiner—Minh Loan Tran
(74) Attorney, Agent, or Firm—Hoffman & Baron, LLP

(57) ABSTRACT

A chip type semiconductor light emitting device includes a semiconductor light emitting chip connected to a pair of electrodes formed on a substrate. The semiconductor light emitting chip is molded together with respective portions of the electrodes by a resin. The electrode has a layered structure having a Cu layer, an Ni layer and an Au layer in the order from the below. Disconnection is formed in the Au layer at a position inside the mold.

5 Claims, 4 Drawing Sheets

CHIP TYPE SEMICONDUCTOR LIGHT EMITTING DEVICE HAVING A SOLDER PREVENTIVE PORTION

BACKGROUND OF THE INVENTION

1. Field of the Invention

This invention relates generally to chip type semiconductor light emitting devices and, more particularly, to a chip type semiconductor light emitting device having a semiconductor light emitting chip connected to an electrode and molded together with part of the electrode by a resin, such as epoxy.

2. Description of the Prior Art

There is known a structure shown in FIG. 7 as a chip type semiconductor light emitting device of this kind. FIG. 7 is a perspective view showing, by partly seeing through, a chip type semiconductor light emitting device 1. In FIG. 7, a pair of electrodes 3, 4 are formed, and the electrode 4 is formed with a pad 4b. Reference characters 3a, 4a respectively represent terminal portions of the pair of electrodes 3, 4.

A semiconductor light emitting chip (hereinafter abbreviated as "LED chip") 5 has, on its top surface, an electrode 5a electrically connected by wire-bonding to the electrode 3 through using a metal wire 6. Also, the LED chip 5 is bonded on the pad 4b of the electrode 4 through a conductive paste. The LED chip 5 at its backside electrode is electrically connected to the electrode 4. The LED 5 and the metal wire 6 are encapsulated together by a mold 7 using a translucent synthetic resin. Meanwhile, each electrode 3, 4 has a terminal portion 3a, 4a extending outside the mold 7 to a backside of the substrate through a side surface thereof.

In this manner, in the example of FIG. 7 the LED chip 5 and the metal wire 6 are encapsulated in a state that the mold 7 at its end faces is partly jointed to the terminal portions 3a, 4a of the electrodes 3, 4. The chip type semiconductor light emitting device 1 is mounted with an backside of the substrate 2 positioned down on a surface of a circuit board, and subjected to a reflow process so that the terminal portions 3a, 4a of the electrodes 3, 4 are brought into electrical connection through solder onto a circuit pattern of the circuit board.

FIG. 8 is a sectional view showing, by magnification, a structure of the electrode and terminal portion formed on the substrate 2. On the substrate 2, a copper (Cu) layer is first formed and then a nickel (Ni) layer and gold (Au) layer are formed on the copper layer by electroplating. Thus, Cu, Ni and Au three conductive layers are formed on the substrate 2.

The Au layer thus formed on the surfaces of the pair of electrodes and terminal portions makes it easy to deposit solder on the terminal portions. Furthermore, where a gold wire is used as a wire-bonding metal wire, preferred electrical connection is provided between the metal wire and the electrode, thus improving the quality of the semiconductor light emitting device 1.

In the case where the semiconductor light emitting device 1 mounted on a circuit board experiences repetition of a reflow process, if the amount of a solder melt is comparatively much, the solder melt may flow along an Au layer on a terminal portion 3a, 4a and intrude at a mold 7 end face toward an electrode 3, 4. FIG. 9 is a perspective view depicting a state that a solder melt 8 flows, as shown by an arrow X, from one terminal portion 3a through a mold 7 end face and intrudes to the electrode 3.

If the solder 8 flows along the Au layer on the surface of the terminal portion 3a, 4a and intrudes through the mold 7 end face to the electrode 3, 4 as shown in FIG. 8, there is a possibility that the metal wire 6 that is wire-bonded to the electrode 3 be broken due to an impact caused by the solder melt 8 or the LED chip 5 be stripped off the pad 4b of the electrode 4. If the metal wire 6 or the semiconductor light emitting chip 5 is damaged due to intrusion of solder 8, a problem results that the semiconductor light emitting device 1 would not operate normally.

SUMMARY OF THE INVENTION

The present invention has been made in view of the above-stated problems, and it is an object to provide a semiconductor light emitting device having parts prevented from being damaged by solder even where solder intrude toward an electrode formed inside a mold during a reflow process.

A semiconductor light emitting device according to the present invention, comprises: a substrate; a pair of electrodes formed on said substrate; a semiconductor light emitting chip electrically connected to said pair of electrodes; a mold formed of a translucent synthetic resin and encapsulating said semiconductor light emitting chip and respective portions of said pair of electrodes; and solder preventive portion formed over an entire width of said electrode at an inside of said mold.

Even if solder flows along an electrode surface from an outside of the mold and intrudes into an inside of the mold, the solder entering is prevented from further advancing by the solder preventive portion. Accordingly, with this invention there is less possibility that the semiconductor light emitting chip or the like be damaged by solder upon conducting solder reflow.

In one embodiment, the above object of the invention is achieved by providing, in a semiconductor light emitting device having a substrate, a pair of electrodes, a semiconductor light emitting chip electrically connected to the pair of electrodes, and a mold formed of a translucent synthetic resin and encapsulating the semiconductor light emitting chip, wherein the pair of electrodes are provided extending from an inside to an outside of the mold to have a surface formed by a gold layer, a disconnection in part of the electrode inside the mold.

In this embodiment, because the disconnection is partly provided in the electrode inside the mold, even if solder flows along the gold layer formed in the surface of the terminal portion and intrudes to the electrode at an inside of the mold during a reflow process, the flow of solder will be stopped by the disconnection of the metal layer. Accordingly, it is possible to prevent the parts of the semiconductor light emitting device from being damaged by solder and hence provide normal operation for the semiconductor light emitting device.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
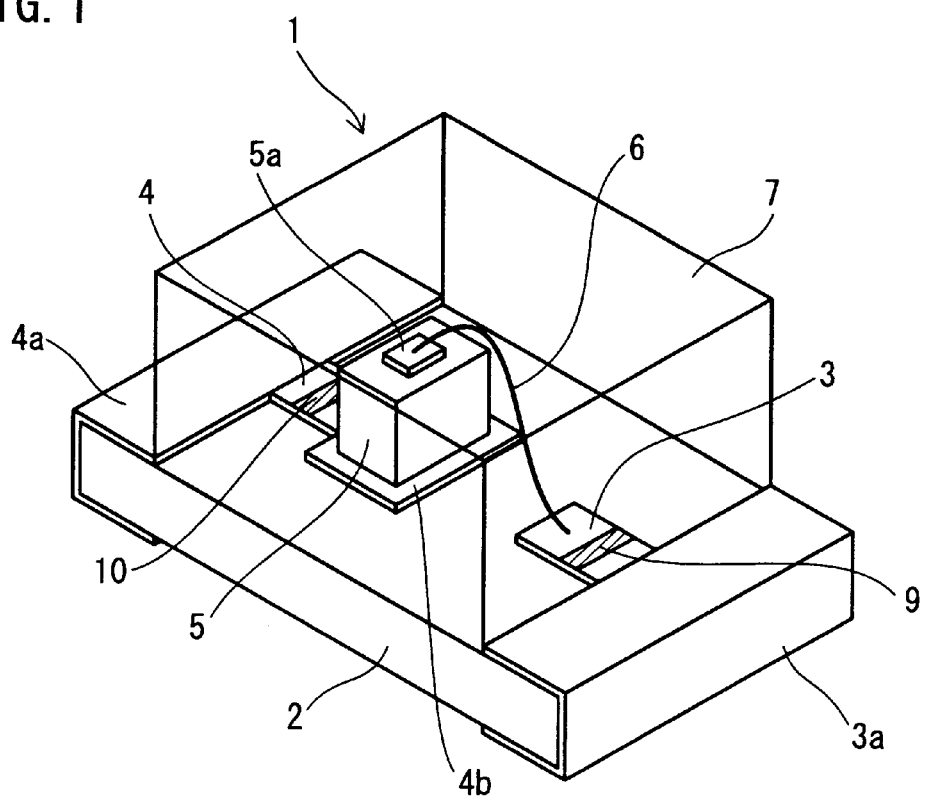
FIG. 1 is a perspective view showing, by partly seeing through, a semiconductor light emitting device according to an embodiment of the present invention.
Figure 2:
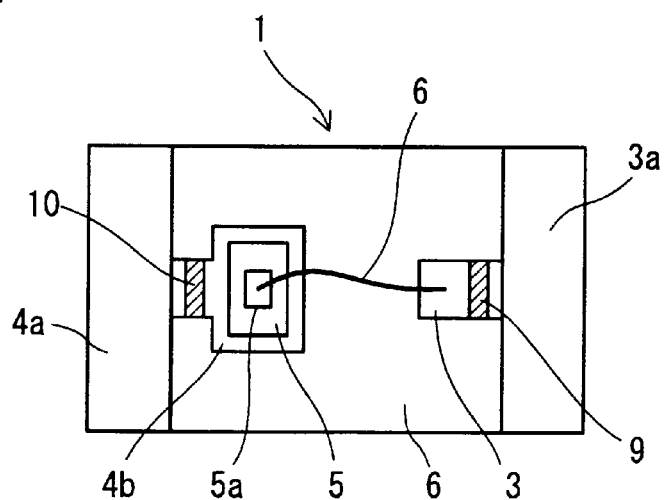
FIG. 2 is a plan view of FIG. 1.
Figure 7:
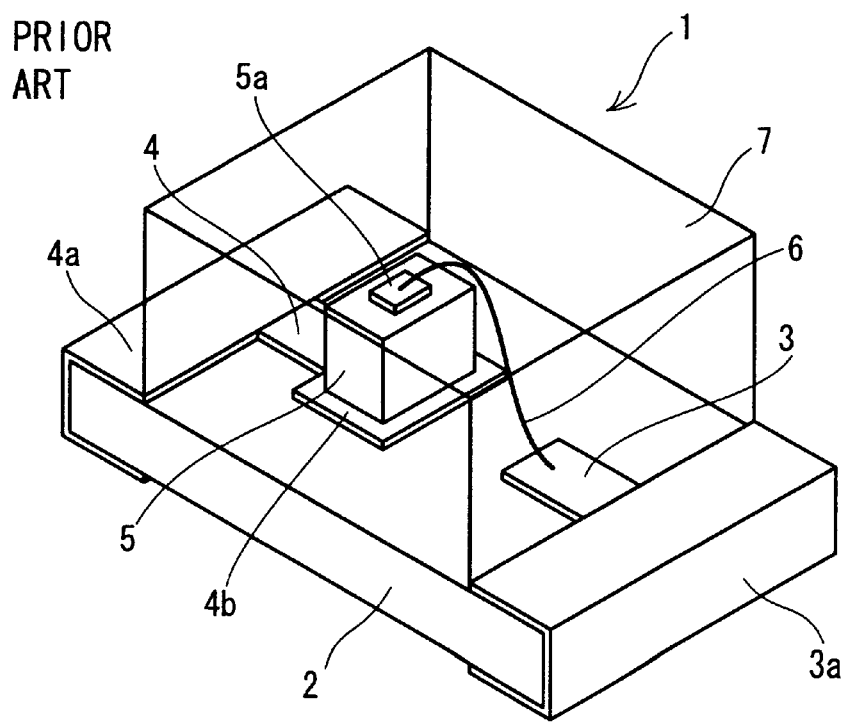
FIG. 7 is a perspective view showing, by partly seeing through, an prior art semiconductor light emitting device.

FIG. 1 is a perspective view of a semiconductor light emitting device showing, by partly seeing through, an embodiment of the present invention, while FIG. 2 is a plan view of FIG. 1. The parts or elements same as or correspond to those of the prior art semiconductor light emitting device as explained in FIG. 7 are denoted by the same reference characters. Incidentally, the semiconductor light emitting device of the invention is applicable with especial effectiveness to a small-sized type, e.g. width by length of the substrate 2 of approximately 2.0 mm×1.25 mm or 1.6 mm×0.8 mm.

Figure 8:
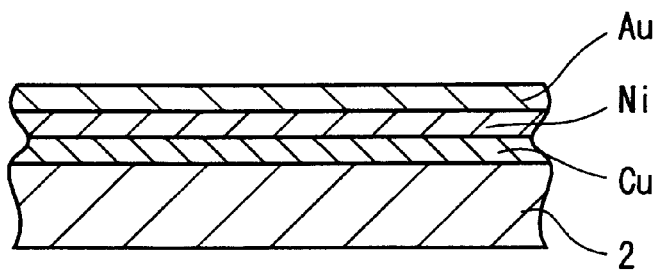
FIG. 8 is a sectional view of an electrode showing an example having a gold layer on an electrode surface.
Figure 9:
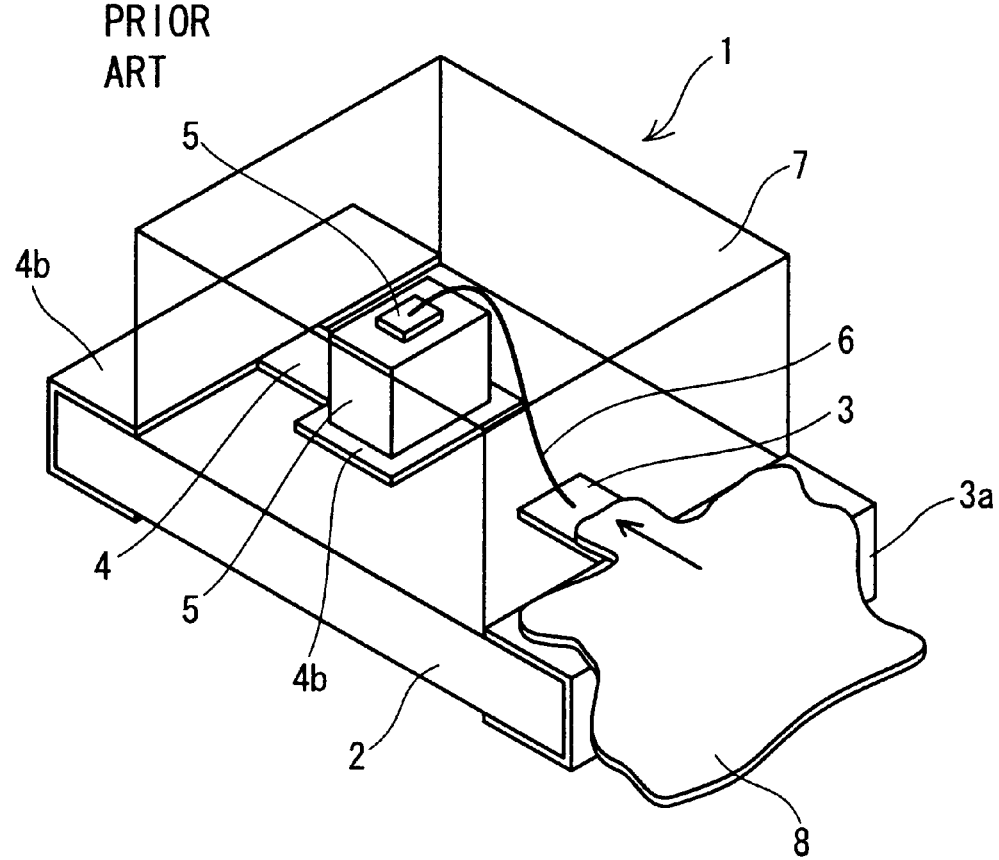
FIG. 9 is a perspective view of a prior art semiconductor light emitting device showing a state that solder intrudes to an inside of a mold.

In FIG. 1 and FIG. 2, on a top surface of the substrate 2 a pair electrodes 3, 4 are provided with their center-side portions opposed to each other. These electrodes 3, 4 each extend through an end face to a backside of the substrate 2. One electrode 4 has, on an end side of a substrate 2 center, a pad 4b on which an LED 5 is to be die-bonded. The other electrode 3 is wire-bonded through a metal wire 6 to be connected to the LED chip 5. The metal wire 6 uses a gold (Au) wire. The pair of electrode 3, 4, as shown in FIG. 8, are formed by three layers of a Cu layer, an Ni layer and Au layer in the order from the below. Disconnections 9, 10 are formed in the respective Au layers deposited at the surface.

The disconnections 9, 10 of the Au layers are formed using a translucent synthetic resin in positions inside the mold 7 and close to an end face of the mold 7, i.e. between a boundary of the mold 7 to the top surface of the substrate 2 and a connection point of the Au wire 6 or LED chip 5 to the electrode 3, 4.

Figure 3:
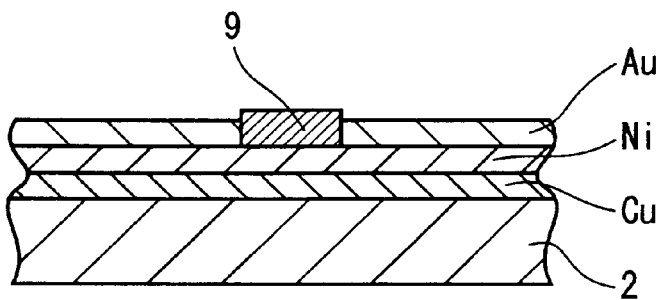
FIG. 3 is a sectional view of an electrode showing an example having a disconnection in a gold layer formed on an electrode surface.
Figure 4:
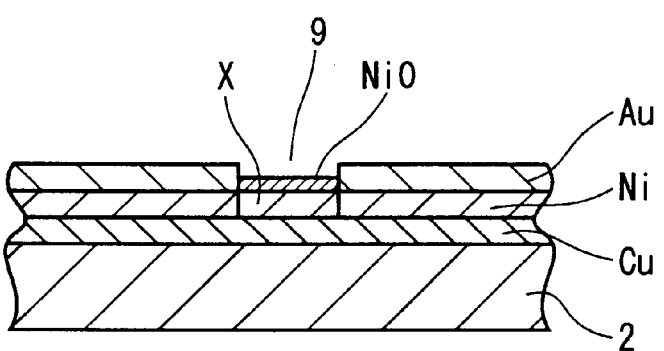
FIG. 4 is a sectional view of an electrode showing another example having a disconnection in a gold layer formed on an electrode surface.
Figure 5:
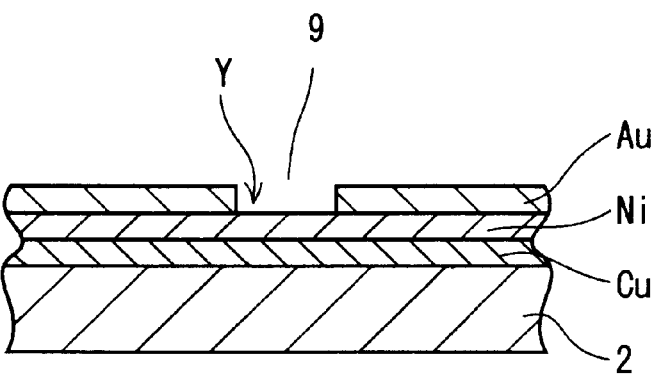
FIG. 5 is a sectional view of an electrode showing still another example having a disconnection in a gold layer formed on an electrode surface.

FIG. 3 to FIG. 5 are sectional views showing a concrete example for providing a disconnection in an Au layer at the surface of an electrode. Although FIG. 3 to FIG. 5 show a disconnection 9 to be formed in one electrode 3 of the pair of electrodes, a similarly-structured disconnection of an Au layer is formed in the other electrode 4.

FIG. 3 shows an example for forming a disconnection 9 of an Au layer by a resist using a semi-transparent epoxy resin. When forming an electrode 3 on a substrate 2, an Ni plating is made on a Cu layer, and then, prior to conducting Au plating, a semi-transparent epoxy resin or the like is applied onto the Ni layer thereby forming a resist.

The resist uses a semi-transparent epoxy resin or the like as an insulator. If Au plating is made on the Ni layer, no Au plating layer will be formed on the resist. Accordingly, the resist portion is formed into a disconnection of the Au layer. Alternatively, after forming a Cu layer on the substrate 2, a resist may be applied onto the Cu layer, followed by forming an Ni layer and Au layer by electroplating. In also this case, no Ni and Au layers will be formed on the resist, thus providing a disconnection of the Au layer at the resist portion.

Because disconnections 9, 10 are provided in the Au layer of a pair of electrodes 3, 4 through using a semi-transparent epoxy resin or the like, even if solder should intrude into an inside of the mold 7 through the Au layer on the surface of the terminal portion 3a, 4a during a reflow process, the flow of solder is stopped by the disconnection 9, 19 in the Au layer. Consequently, there is less possibility that the solder intruding the mold 7 causes damage to such parts of the semiconductor light emitting device 1 as the metal wire 6 that is wire-bonded to the electrode 3 and the semiconductor light emitting chip 5 die-bonded on the pad 4b.

As another embodiment of the invention, paints indicative of a polarity sign (hereinafter referred to as "silk(s)") may be applied, in place of the resist, as Au layer disconnections on a pair of electrodes 3, 4, in order to discriminate a polarity of the semiconductor light emitting device. These silks also uses an insulator. Consequently, if a silk is applied onto a Cu or Ni layer similarly to the resist case to thereafter form an Au layer by electroplating, no Au plating layer will be formed on the silk. Thus obtained is a disconnection of the Au layer.

FIG. 4 shows an example for forming another structure of a disconnection 9 of an Au layer. In the example of FIG. 4, a part of an Ni layer, or an portion X shown in the figure, is oxidized to form thereon a nickel oxide (NiO) layer as a disconnection 9 in the Au layer.

Such an NiO layer can be formed by a process including, for example, exposing the portion X of the Ni layer to the air and covering other portions by a mask. By forming an NiO layer in part of the Ni layer, even if Au plating is made over the Ni layer, no Au plating layer will be formed on the NiO layer. Thus obtained is a disconnection of the Au layer.

FIG. 5 shows an example for forming a still another structure of a disconnection 9 of an Au layer. In the example of FIG. 5, as was explained in the prior art, a Cu layer is formed on a substrate 2 and then an Ni layer and an Au layer are formed on the Cu layer by an electroplating process. Then, a part of the Au layer, or portion Y shown in the figure, is cut away by machining, thus providing a disconnection 9 of the Au layer.

In also FIG. 4 and FIG. 5, the flow of solder intruding through the Au layer on the terminal portion 3a into an inside of the mold is stopped by the disconnection 9 in the Au layer. The Au layer disconnection shown in FIG. 4 and FIG. 5 is also formed in the electrode 4. Accordingly, it is possible to prevent the parts of the semiconductor light emitting device, such as the metal wire 6 and the LED chip 5 from being damaged due to intrusion of solder during a reflow process.

Figure 6:
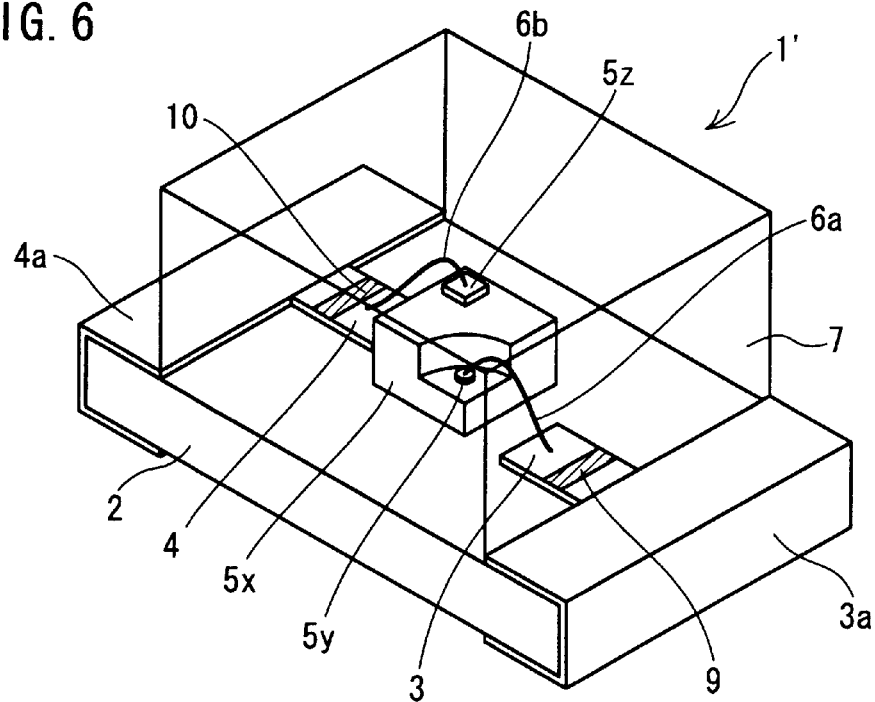
FIG. 6 is a perspective view showing, by partly seeing through, a semiconductor light emitting device according to another embodiment of the invention.

Although the examples of FIG. 1 and FIG. 2 are on a chip type semiconductor light emitting device having a structure that the LED chip 5 at its one electrode is bonded on the pad 4b through a conductive paste, the invention is applicable to other types of chip type semiconductor light emitting devices using a semiconductor light emitting chip. FIG. 6 is a perspective view showing, by partly seeing through, a semiconductor light emitting device 1a according to another embodiment of the invention.

In FIG. 6, 5x is a semiconductor light emitting chip (LED chip) formed of a gallium-nitride based compound semiconductor for emitting, for example, bluish light. On a sapphire substrate are layered an n-type layer (cladding layer), an active layer (light emitting layer), and a p-type layer (cladding layer). The n-type layer, active layer and p-type layer thus overlaid are partly etched to expose part of the n-type layer on which one electrode (n-side electrode) 5y is to be formed. Also, the other electrode (p-side electrode) 5z is provided on the p-type layer.

The LED chip 5x is mounted on the substrate 2, i.e. the pad 4b (FIG. 1) by die-bonding, and its n-side electrode 5y is wire-bonded through a metal wire 6a to the electrode 3. On the other hand, the p-side electrode 5z is wire-bonded through a metal wire 6b to the electrode 4. The metal wires 6a, 6b use gold (Au) wires. In this manner, in the example of FIG. 6 the n-side electrode 5y and p-side electrode 5z of the LED chip 5x are formed in a same main surface thereof, so that the n-side electrode 5y and the p-side electrode 5z are respectively connected through the metal wires 6a, 6b to the electrodes 3, 4 in pair.

In the example of FIG. 6, if Au layer disconnections 9, 10 as explained in FIG. 1 are formed in part of the electrodes 3, 4 in pair inside the mold 7, even if solder intrude into an inside of the mold 7 during a reflow process, the flow of solder is cutt off by these disconnections 9, 10. It is therefore possible to prevent the parts, such as the metal wires 6a, 6b and the LED chip 5x, from being damaged by solder.

In also the example of FIG. 6, the disconnections 9, 10 are formed by forming resist or silks, partially oxidizing an Ni layer, or cutting out by machining part of an Au layer once formed on an Ni layer, as explained in FIG. 3 to FIG. 5.

In the embodiment, the electrodes at portions inside the mold are partly formed by disconnections in the gold layers, as explained above. Consequently, even if solder flows along the gold layer on a terminal portion and intrudes to an electrode inside the mold during a reflow process, the flow of solder will be stopped by the disconnection in the metal layer. Consequently, it is possible to prevent the semiconductor light emitting device parts from being damaged due to solder and hence to normally operate the semiconductor light emitting device.

Incidentally, in the above embodiment the disconnections serving as solder preventive layer were formed on the uppermost layers (gold layer) of the electrodes 3 and 4. That is, because in the embodiment of FIG. 3 to FIG. 5 the gold layer is separated by the disconnection 9, the solder intruding along a gold layer surface is stopped by the disconnection. It is noted that such a solder preventive layer may be a step formed in the surface of an electrode. The step may be formed in a position lower than the electrode (gold layer) surface, as shown in FIG. 4 and FIG. 5, or in a position upper than the electrode surface. The step may be formed by depressing or raising an electrode surface.

Also, the solder preventive portion may be a roughened surface formed in an electrode surface. In this case, solder propagating through a smoothened electrode surface is stopped by the roughened surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device, comprising:
   a substrate;
   a pair of electrodes formed on said substrate, at least one of said electrodes having an upper conductive layer;
   a semiconductor light emitting chip electrically connected to said pair of electrodes;
   a mold formed of a translucent synthetic resin and encapsulating said semiconductor light emitting chip and respective portions of said of electrodes; and
   a solder preventive portion formed in said upper conductive layer of said at least one electrode over an entire width of said electrode at an inside of said mold, said solder preventive portion forming a disconnection in said upper conductive layer for stopping a flow of solder into said mold.

2. A semiconductor light emitting device according to claim 1, wherein said solder preventive portion includes an insulation material disposed in said disconnection of said upper conductive layer.

3. A semiconductor light emitting device according to claim 2, wherein said insulation material includes a resin.

4. A semiconductor light emitting device according to claim 2, wherein said insulation material includes a metal oxide to form lower conductive layers than said upper conductive layer.

5. A semiconductor light emitting device according to claim 1, wherein said solder preventive portion includes a step.

* * * * *